(12) United States Patent
Chen et al.

(10) Patent No.: US 7,962,990 B2
(45) Date of Patent: Jun. 21, 2011

(54) BRUSH BOX CLEANER MODULE WITH FORCE CONTROL

(75) Inventors: Hui (Fred) Chen, Burlingame, CA (US); Joseph Yudovsky, Campbell, CA (US); Allen L. D'Ambra, Burlingame, CA (US)

(73) Assignee: Applied Materials, Inc., Santa Clara, CA (US)

( * ) Notice: Subject to any disclaimer, the term of this patent is extended or adjusted under 35 U.S.C. 154(b) by 264 days.

(21) Appl. No.: 12/243,700

(22) Filed: Oct. 1, 2008

(65) Prior Publication Data

US 2010/0078041 A1    Apr. 1, 2010

(51) Int. Cl.
*A47L 25/00* (2006.01)
*A46B 13/02* (2006.01)

(52) U.S. Cl. ............................................. 15/88.3; 15/77

(58) Field of Classification Search ............ 15/77, 88.3, 15/88.4, 102, 103.5
See application file for complete search history.

(56) References Cited

U.S. PATENT DOCUMENTS

| | | | | |
|---|---|---|---|---|
| 5,475,889 | A | * | 12/1995 | Thrasher et al. ............... 15/88.3 |
| 5,875,507 | A | * | 3/1999 | Stephens et al. ............... 15/102 |
| 6,119,708 | A | | 9/2000 | Fishkin et al. |
| 6,143,089 | A | * | 11/2000 | Stephens et al. .................. 134/6 |
| 6,299,698 | B1 | | 10/2001 | Emami et al. |
| 6,427,566 | B1 | * | 8/2002 | Jones et al. ...................... 82/101 |
| 6,516,816 | B1 | | 2/2003 | Husain et al. |
| 6,986,185 | B2 | | 1/2006 | Sugarman et al. |
| 7,229,504 | B2 | | 6/2007 | Sugarman et al. |
| 2003/0200988 | A1 | | 10/2003 | Brown et al. |
| 2005/0087212 | A1 | * | 4/2005 | Yudovsky et al. ................ 134/6 |
| 2005/0109371 | A1 | | 5/2005 | Sin et al. |
| 2005/0211276 | A1 | | 9/2005 | Yudovsky et al. |
| 2005/0268937 | A1 | | 12/2005 | Sugarman |
| 2007/0209135 | A1 | | 9/2007 | Chen et al. |
| 2007/0221249 | A1 | | 9/2007 | Sugarman et al. |

FOREIGN PATENT DOCUMENTS

| | | |
|---|---|---|
| JP | 10321571 A | 12/1998 |
| JP | 11026419 A | 1/1999 |
| JP | 2006196636 A | 7/2006 |
| WO | WO-2005044474 A1 | 5/2005 |

OTHER PUBLICATIONS

International Search Report and Written Opinion dated Mar. 31, 2010 for International Application No. PCT/US2009/056686.

* cited by examiner

*Primary Examiner* — Michael Barr
*Assistant Examiner* — Saeed T Chaudhry
(74) *Attorney, Agent, or Firm* — Patterson & Sheridan, L.L.P.

(57) ABSTRACT

Embodiments of the present invention relates to an apparatus and method for cleaning a substrate using scrubber brushes. One embodiment of the present invention provides a substrate cleaner comprises two scrubber brush assemblies movably disposed in a processing volume. The two scrubber brush assemblies are configured to contact and clean opposite surfaces of a substrate disposed in the processing volume. The substrate cleaner also comprises a positioning assembly configured to simultaneously adjust positions of the two scrubber brush assemblies, wherein the positioning assembly makes substantially the same amount of adjustment to the first and second scrubber brush assemblies in mirror symmetry.

20 Claims, 7 Drawing Sheets

BRUSH BOX CLEANER MODULE WITH FORCE CONTROL

BACKGROUND OF THE INVENTION

1. Field of the Invention

Embodiments of the present invention generally relate to an apparatus and a method for processing semiconductor substrates. More particularly, embodiments of the present invention provide an apparatus and a method for cleaning semiconductor substrates.

2. Description of the Related Art

During fabrication of a semiconductor device, various layers, such as oxides, copper, require planarization to remove steps or undulations prior to formation of subsequent layers. Planarization is typically performed mechanically, chemically, and/or electrically by pressing the device side of a semiconductor substrate against a polishing pad which is saturated with a polishing solution, such as an abrasive compound, and by rotating the polishing pad relative to the semiconductor substrate. Multiple steps of polishing are generally performed using different polishing pads and polishing solutions to achieve the desired flatness and smoothness on the device side.

The planarization process can be followed by a cleaning process which removes residual of the polishing solutions and/or particles from polishing. Conventional cleaning processes generally include scrubbing the substrate surfaces with mechanical scrubbing devices using brushes made from porous or sponge like materials, such as polyvinyl acetate (PVA), or brushes made with nylon bristles. When cleaning with scrubber brushes, the scrubber brushes generally approach the substrate from both the front side and the back side to contact the substrate and apply a brushing force against the substrate. It is desirable to monitor and control the force applied to the substrate during cleaning to avoid damage to the substrate. However, conventional brush cleaners need improvement in controlling the movement of scrubbing brushes and resulting forces applied to the substrate during cleaning.

Therefore, there is a need for an apparatus and a method for cleaning a substrate using scrubber brushes with motion and force control.

SUMMARY OF THE INVENTION

The present invention generally relates to a method and apparatus for cleaning a substrate after a polishing process. Particularly, embodiments of the present invention relate to an apparatus and method for cleaning a substrate using scrubber brushes.

One embodiment provides a substrate cleaner, comprising a chamber body defining a processing volume, wherein the chamber body has a top opening configured to allow transfer of a substrate, first and second scrubber brush assemblies movably disposed in the processing volume, wherein the first and second scrubber brush assemblies are configured to contact and clean opposite surfaces of a substrate disposed in the processing volume, and a positioning assembly configured to simultaneously adjust positions of the first and second scrubber brush assemblies, wherein the positioning assembly makes substantially the same amount of adjustment to the first and second scrubber brush assemblies in mirror symmetry.

Another embodiment provides a substrate cleaner comprising a chamber body defining a processing volume, wherein the chamber body has a top opening configured to allow entry and exit of a substrate, first and second substrate rollers disposed in a lower portion of the processing system, wherein the first and second substrate rollers are configured to receive a substrate and rotate the substrate in a vertical orientation, first and second scrubber brush assemblies disposed in the processing volume, wherein the first and second scrubber brush assemblies are configured to contact and clean opposite surfaces of the substrate supported by the first and second substrate rollers, and a positioning assembly configured to adjust positions of the first and second scrubber brush assemblies relative to each other, wherein the positioning assembly comprises an actuator having a first end connected with the first scrubber brush assembly and a second end connected with the second scrubber brush assembly, and a restraint assembly connected between the first end and second end of the actuator, wherein the restraint assembly is configured to make substantially the same amount of adjustment to the first and second scrubber brush assemblies in mirror symmetry.

Yet another embodiment provides a method for cleaning a substrate comprising transferring the substrate to a cleaning chamber, positioning the substrate on two substrate rollers disposed in a processing volume of the cleaning chamber, rotating the substrate using the two substrate rollers while the substrate is in a substantially vertical orientation, moving first and second scrubber brush assemblies towards the substrate from opposite sides of the substrate, wherein the first and second scrubber brush assemblies are moved in symmetric manner, contacting the substrate with the first and second scrubber brush assembly, and cleaning the substrate by rotating the first and second scrubber brush assemblies.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the present invention generally relate to an apparatus and a method for cleaning a semiconductor substrate after a polishing process. Particularly, embodiments of the present invention relates to an apparatus and method for cleaning a substrate using scrubber brushes. One embodiment of the present invention provides a substrate cleaner comprising two scrubber brush assemblies movably disposed in a processing volume. The two scrubber brush assemblies are configured to contact and clean opposite surfaces of a substrate disposed in the processing volume. The substrate cleaner also comprises a positioning assembly configured to simultaneously adjust positions of the two scrubber brush assemblies, wherein the positioning assembly makes substantially the same amount of adjustment to the first and second scrubber brush assemblies symmetrically. The symmetrical movement of the scrubber brush assemblies allows substantially symmetrical forces apply to opposite sides of the substrate, thus reducing damage to the substrate.

Figure 1:
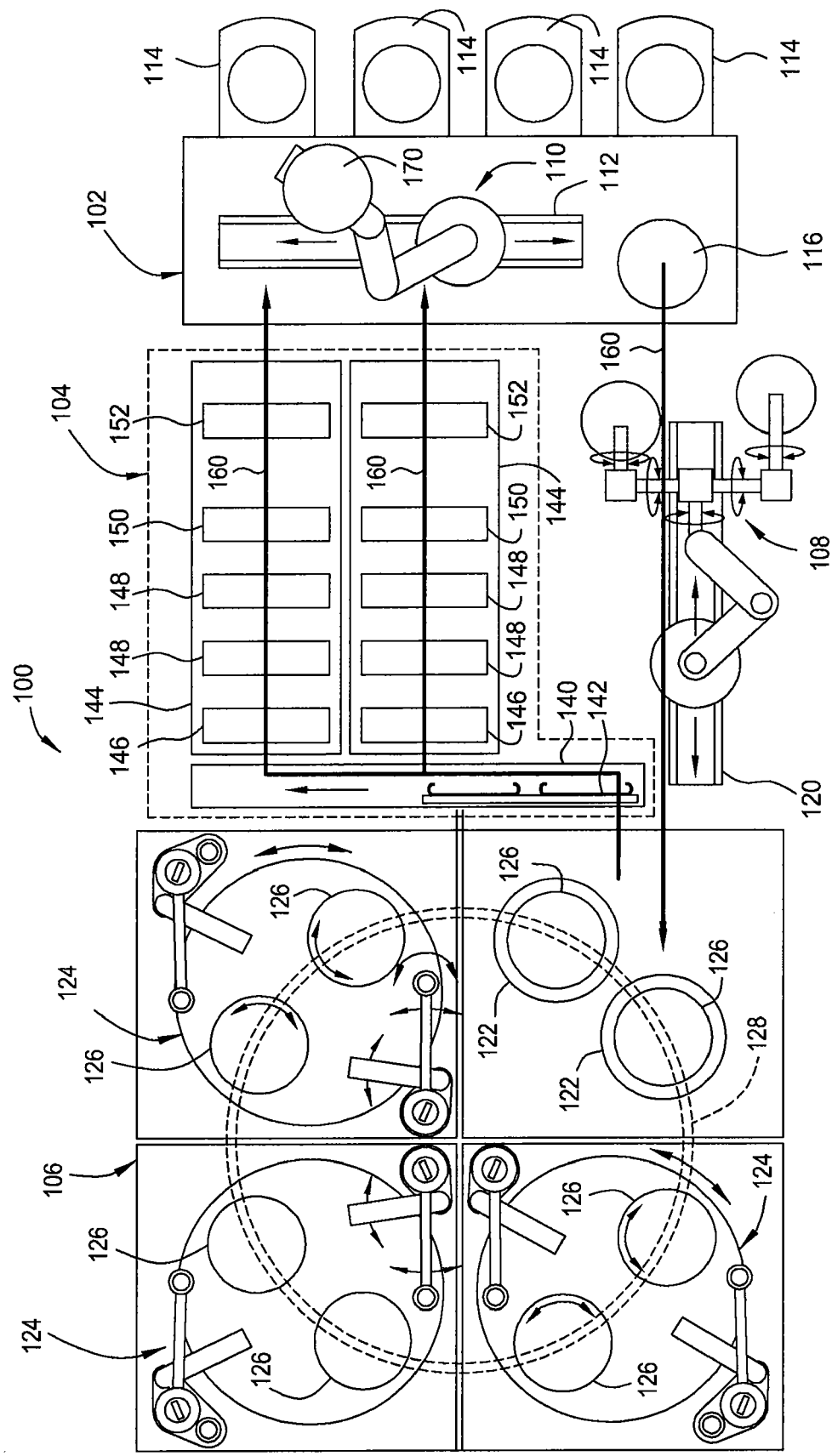
FIG. 1 is a schematic plan view of a polishing system in accordance with one embodiment of the present invention.

FIG. 1 is a schematic plan view of a polishing system 100 in accordance with one embodiment of the present invention. The polishing system 100 generally includes a factory interface 102, a cleaner module 104 and a polishing module 106. A wet robot 108 is provided to transfer substrates 170 between the factory interface 102 and the polishing module 106. The wet robot 108 may also be configured to transfer substrates between the polishing module 106 and the cleaner module 104. In one mode of operation, the flow of substrates, such as semiconductor wafers or other work piece, through the polishing system 100 is indicated by arrows 160.

The factory interface 102 generally includes a dry robot 110 which is configured to transfer substrates 170 among one or more cassettes 114 and one or more transfer platforms 116. In one embodiment, the dry robot 110 is mounted on a track 112.

The wet robot 108 generally is configured to retrieve the substrates 170 from the factory interface 102 in a face-up horizontal orientation, to flip the substrates 170 to a face-down horizontal orientation to the polishing module 106, and to rotate the substrates 170 to a vertical orientation to the cleaner module 104. In one embodiment, the wet robot 108 is mounted on a track 120 and facilitates linear translation of the wet robot 108.

The polishing module 106 generally comprises a plurality of polishing heads 126 configured to retain substrates 170, load cups 122 configured to receive the substrates 170 from the wet robot 108 and transfer the substrates 170 to the polishing heads 126, and two or more polishing stations 124 configured to polish the substrates 170 on the polishing heads 126.

In one embodiment, the polishing heads 126 are coupled to an overhead track 128. The overhead track 128 is configured to transfer the polishing heads 126 and to position the polishing heads 126 selectively over the polishing stations 124 and load cups 122. In the embodiment, the overhead track 128 has a circular configuration which allows the polishing heads 126 to be selectively rotated over and/or clear of the load cups 122 and the polishing stations 124. It is contemplated that the overhead track 128 may have other configurations including elliptical, oval, linear or other suitable orientation.

During processing, the substrates 170 are transferred from the cassette 114 to the transfer platform 116 by the dry robot 110. The substrates 170 are then picked up by the wet robot 108 and transferred to the load cups 122. Returning to FIG. 1, processed substrates are returned to the load cups 122 of the polishing module 106 for transfer by the wet robot 108 to the cleaner 104. The cleaner 104 generally includes a shuttle 140 and one or more cleaning modules 144. The shuttle 140 includes a transfer mechanism 142 which facilitates hand-off of the processed substrates from the wet robot 108 to the one or more cleaning modules 144.

The processed substrates are transferred from the shuttle 140 through of the one or more cleaning modules 144 by an overhead transfer mechanism (not shown). In the embodiment depicted in FIG. 1, two cleaning modules 144 are shown in an aligned, parallel arrangement. Each of the cleaning modules 144 generally include one or more megasonic cleaners, one or more brush boxes, one or more spray jet boxes and one or more dryers. In the embodiment depicted in FIG. 1, each of the cleaning modules 144 includes a megasonic cleaner 146, two brush box modules 148, a jet cleaner module 150 and a dryer 152. Dried substrates leaving the dryer 152 are rotated to a horizontal orientation for retrieval by the dry robot 110 which returns the dried substrates 170 to an empty slot in one of the wafer storage cassettes 144. Embodiments of cleaning modules may be adapted to benefit from the invention is a DESICA® cleaner, available from Applied Materials, Inc., located in Santa Clara, Calif.

In one embodiment, a transfer device (not shown) is used to retrieve and advance substrates 170 through the cleaning module 144 sequentially, from the megasonic cleaner 146 to the brush box module 148 then to the jet cleaner module 150 and the dryer 152. Each module 146, 148, 150 focuses on a different cleaning function to achieve a desired cleaning effect.

The megasonic cleaner 146 is configured to perform an efficient cleaning step using megasonic energy. Embodiments of a megasonic cleaner may be found in U.S. Pat. No. 6,119,708, entitled "Method and Apparatus for Cleaning the Edge of a Thin Disc".

The jet cleaner module 150 is configured to perform a cleaning step using pressurized liquid.

The dryer 152 is configured to quickly dry a substrate after cleaning to remove bath residue and prevent streaking and spotting caused by evaporation. A description of a dryer may be found in U.S. Pat. No. 6,516,816, entitled "Spin-Rinse-Dryer".

The brush box module 148 is configured to perform a cleaning step using mechanical contact, such as scrubbing motion. Embodiments of a brush box module are also described with FIGS. 2-4 of the present application.

Figure 2:
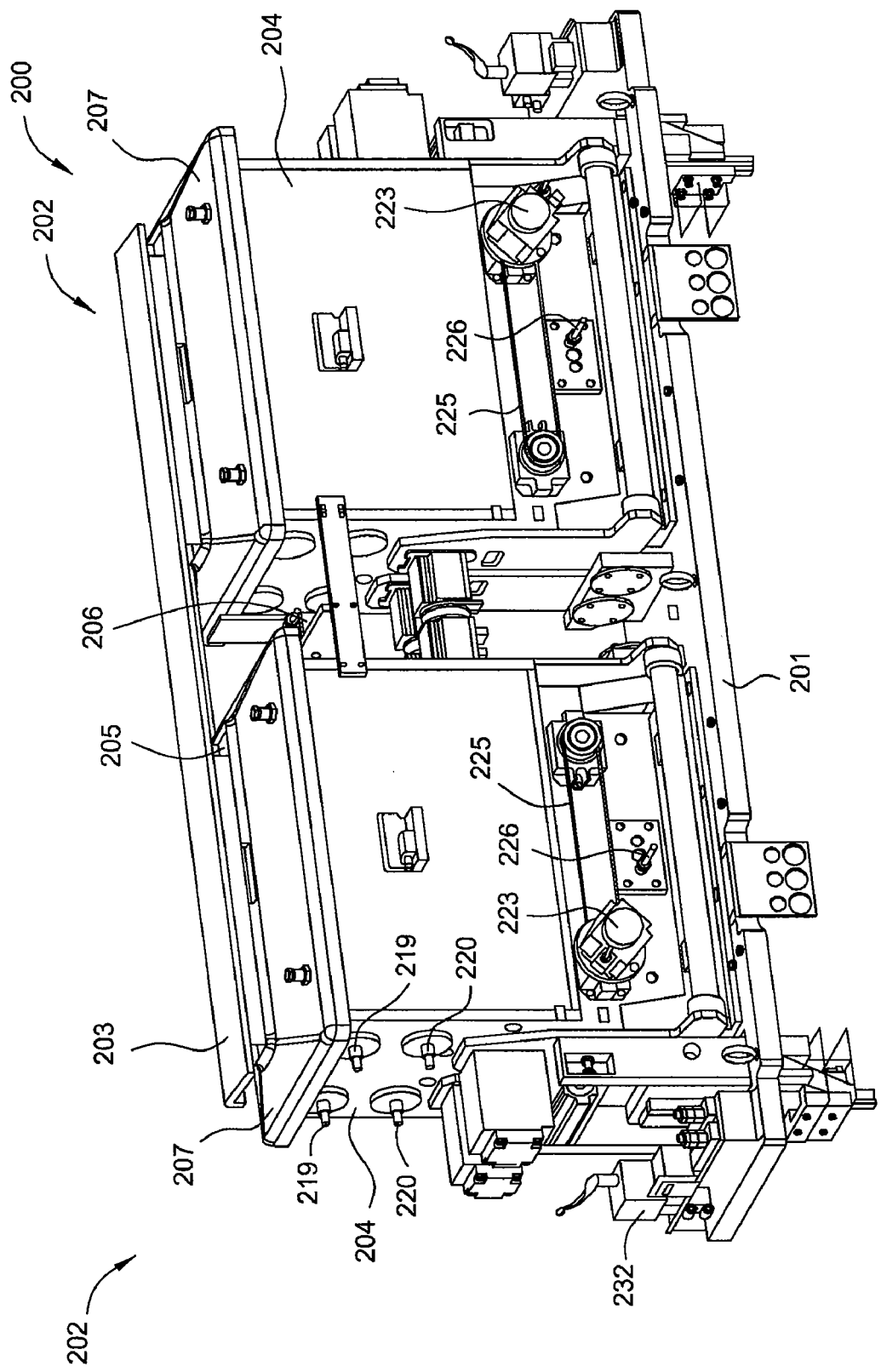
FIG. 2 is a schematic perspective view of a brush box assembly in accordance with one embodiment of the present invention.

FIG. 2 is a schematic perspective view of a brush box assembly 200 in accordance with one embodiment of the present invention. The brush box assembly 200 comprises two brush box modules 202 secured on a supporting frame 201. Each brush box module 202 is configured to receive and clean a substrate in a vertical orientation using scrubber brushes. One or more brush box assemblies 200 may be used in a system configured to clean two substrates in a parallel manner, for example in the same manner as the brush box module 148 in the cleaner module 104 of FIG. 1.

Each of the two brush box module 202 has an opening 205 formed on a surface, such as a top 207 of a body 204. The opening 205 is configured to allow passage of a substrate. During processing, substrates are transferred to above the brush box assembly 200, then lowered into the brush box modules 202 for cleaning, and picked up after cleaning by a substrate handler (not shown), such as the wet robot 108 of FIG. 1.

During cleaning, the openings 205 may be closed by a sliding lid 203 to prevent cleaning solution from splashing out and prevent outside particles from entering the brush box modules 202. In one embodiment, the sliding lid 203 is configured to cover the opening 205 of both brush box modules 202. In one embodiment, an actuator 206 is coupled to the sliding lid 203 and configured to facilitate opening and closing of the openings 205.

Figure 3:
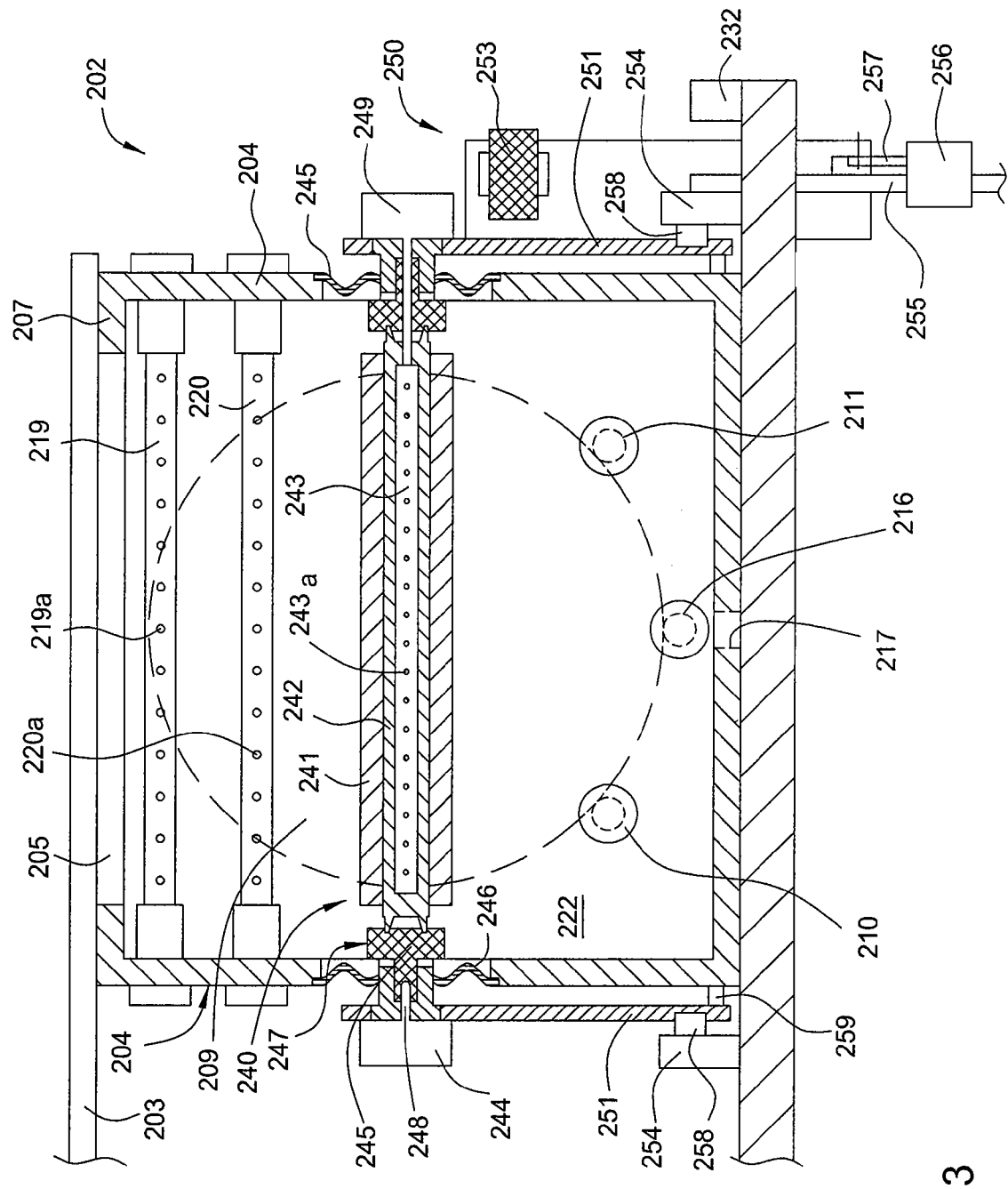
FIG. 3 is a schematic sectional side view of a brush box module in accordance with one embodiment of the present invention.
Figure 4A:
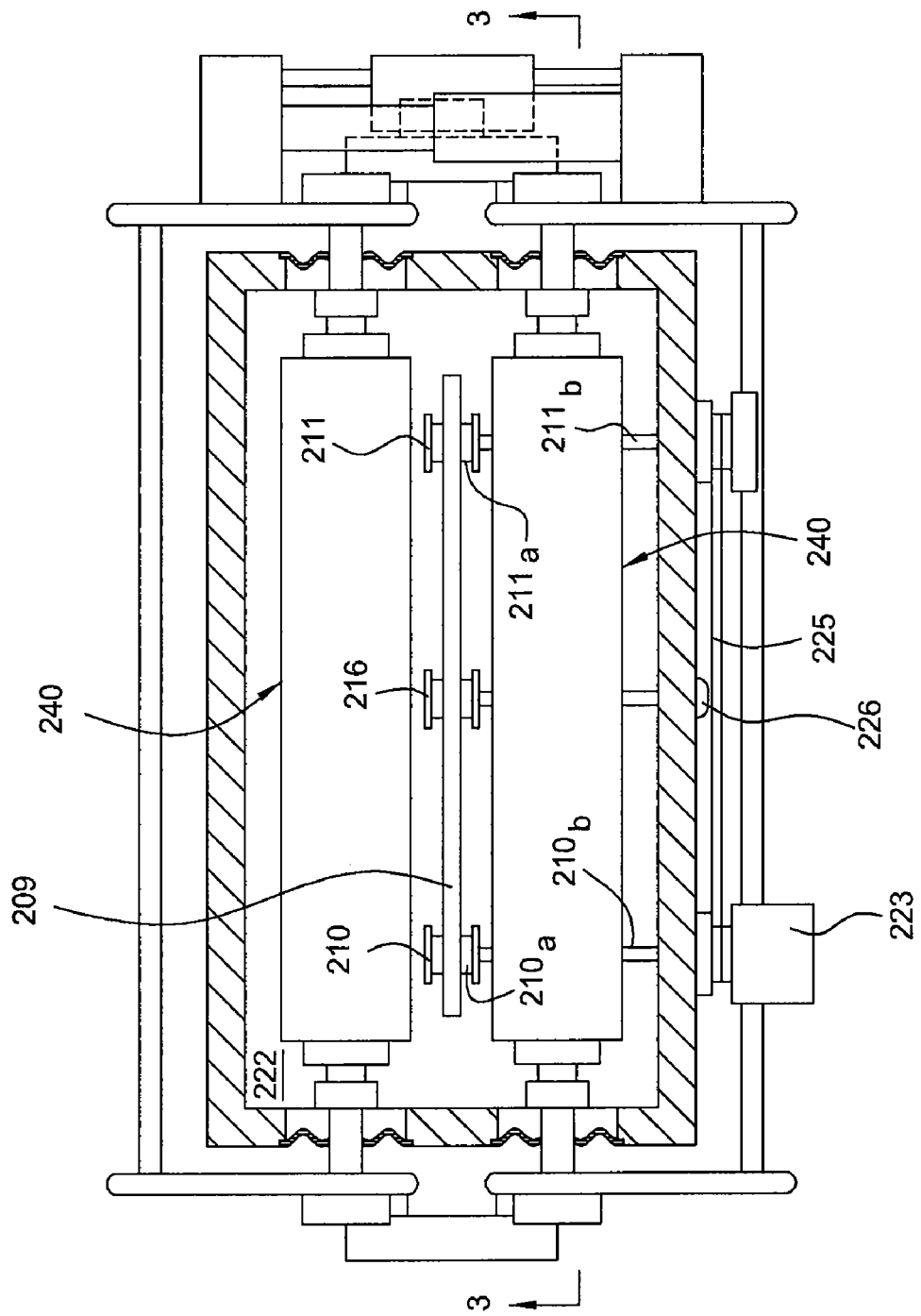
FIG. 4A is a schematic top view of the brush box module of FIG. 3.
Figure 5A:
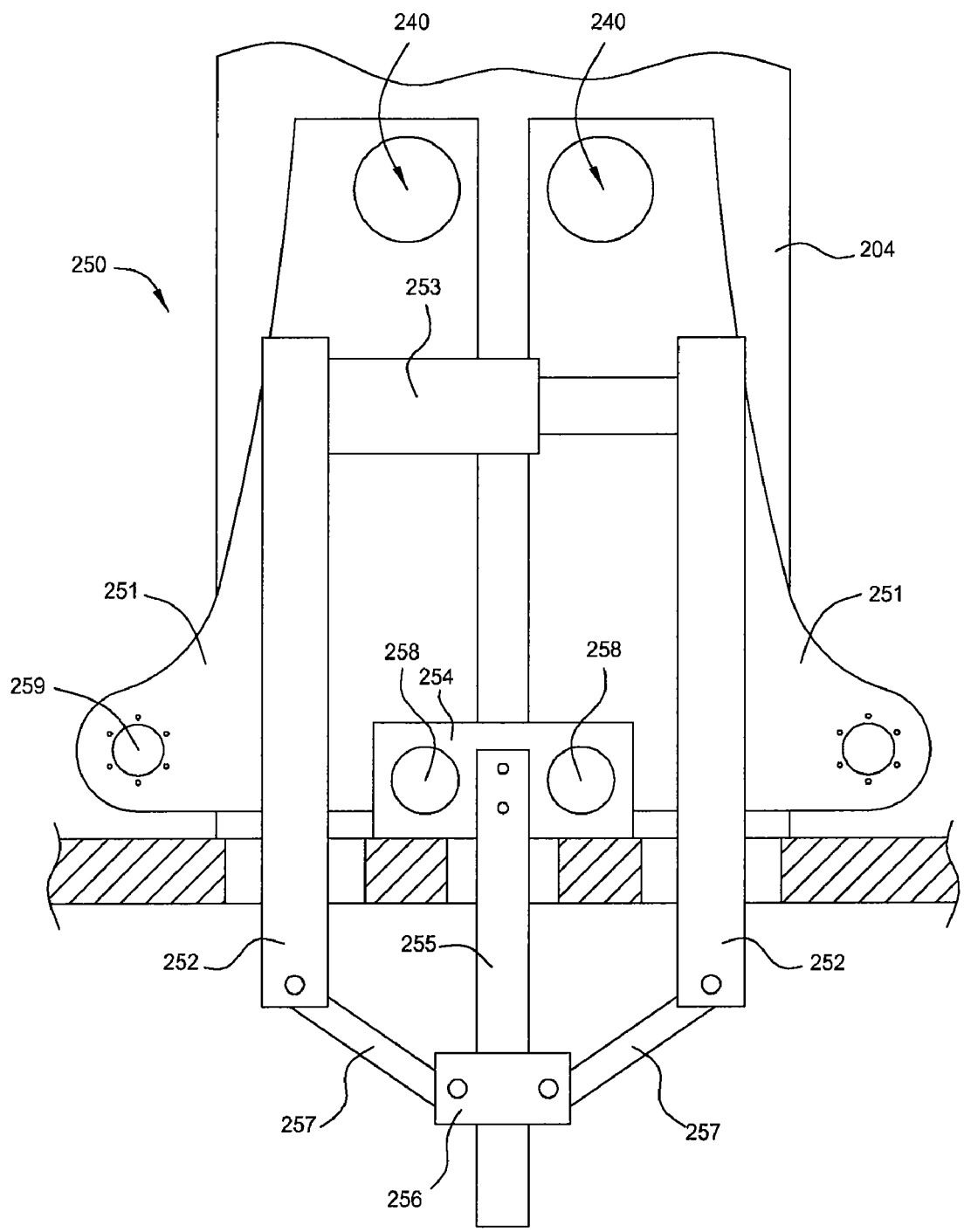
FIG. 5A is a schematic partial side view of the brush box module of FIG. 3.

FIG. 3 is a schematic sectional side view of the brush box module 202 in accordance with one embodiment of the present invention. FIG. 4A is a schematic top view of the brush box module 202 of FIG. 3. FIG. 5A is a schematic partial side view of the brush box module 202 of FIG. 3.

The body 204 of the brush box module 202 defines a processing volume 222 configured to retain and process a substrate 209 therein. The substrate 209 can enter and exit the processing volume 222 through the opening 205 of the top 207. An exhaust 217 is in fluid communication with the processing volume 222. The brush box module 202 comprises two substrate rollers 210, 211 disposed in a lower portion of the processing volume 222. Each substrate roller 210, 211 has a recess 210a, 211a respectively configured to receive the substrate 209 near an edge. In one embodiment, the substrate rollers 210, 211 are coupled to driving axis 210b, 211b respectively.

The driving axis 210b, 211b are coupled to driving mechanism to rotate the substrate rollers 210, 211 respectively. The driving axis 210b, 211b may be rotated by different motors or share the same motor. In one embodiment, the driving axis 210b is directly coupled to a motor 223 and the driving axis 211b is coupled with the motor 223 via a belt assembly 225. During processing, the substrate rollers 210, 211 rotate at a substantially same rate and drive the substrate 209 to rotate through friction.

In one embodiment, the brush box module 202 comprises a sensor wheel 216 disposed in a position to make contact with the substrate 209 during processing. The sensor wheel 216 is configured to rotate passively with the substrate 209 and to transfer the rotation rate of the substrate 209 to a rotation sensor 226. In one embodiment, the sensor wheel 216 is disposed in a lower portion of the processing volume 222 so that the substrate 209 rests on the sensor wheel 216. The rotation sensor 226 is further coupled with a system controller 232.

The brush box module 202 comprises a pair of scrubber brush assemblies 240 disposed above the substrate rollers 210, 211 in the processing volume 222. The scrubber brush assemblies 240 are positioned to extend along opposite sides of the substrate 209 and configured to movably contact the substrate 209 during cleaning.

Each of the scrubber brush assemblies 240 comprises a cylindrical scrubber brush 241 configured to contact the substrate 209. The cylindrical scrubber brush 241 has a plurality of raised features (not shown) protruding from outer surface. The cylindrical scrubber brush 241 is mounted on a mandrel assembly 242. The mandrel assembly 242 is further attached to mounting shafts 245 at both ends. One mounting shaft 245 is coupled to a driving shaft 248 of a motor 244 configured to rotate the cylindrical scrubber brush 241. Another mounting shaft 245 is connected to a cleaning solution supply 249.

In one embodiment, the mandrel assembly 242 has an inner volume 243 extend lengthwise. A plurality of openings 243a is formed through the mandrel assembly 242. The inner volume 243 is in fluid communication with the cleaning solution supply 249 and configured to provide a cleaning solution to the cylindrical scrubber brush 241 via the plurality of openings 243a.

The scrubber brush assemblies 240 are disposed in the processing volume 222 via openings 246 formed on the body 204. The openings 246 are substantially larger then an outer diameter of the scrubber brush assemblies 240. A membrane seal 247 is coupled between the scrubber brush assemblies 240 and each opening 246. The membrane seals 247 allow the scrubber brush assemblies 240 to move laterally within the openings 246 to press or release the substrate 209 during cleaning.

The motor 244 is configured to drive the scrubber brushes 241 at a selected rotational speed. In one embodiment, the motor 244 is configured to rotate the scrubber brush 241 at a rotational speed of about 50 to 700 RPM.

Figure 4B:
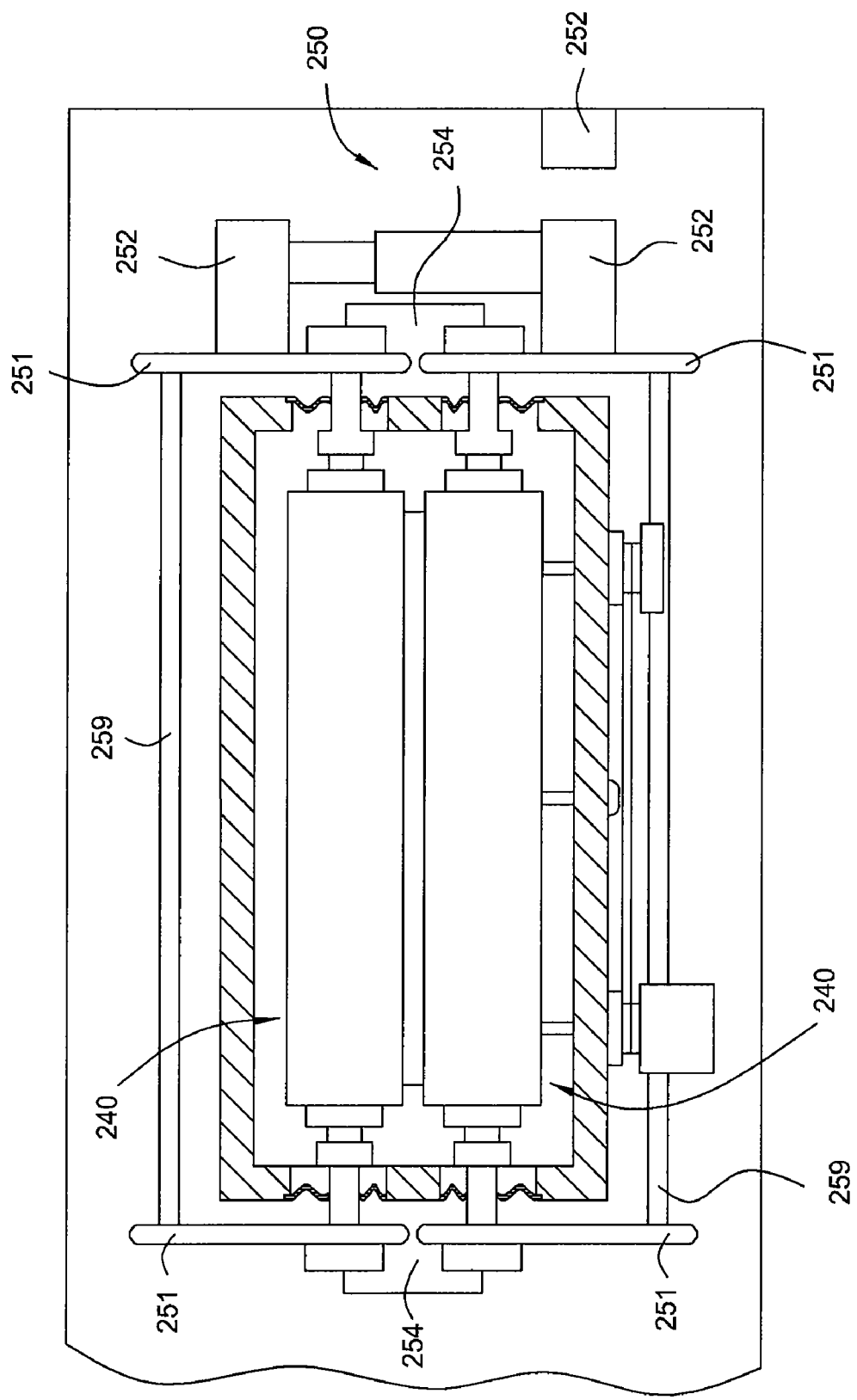
FIG. 4B is a schematic top view of the brush box module of FIG. 3 with scrubber brushes in cleaning position.

The brush box module 202 further comprises a positioning assembly 250 configured to move the scrubber brush assemblies 240 relative to the substrate 209. FIG. 4A schematically illustrate the brush box module 202 when the scrubber brush assemblies 240 are moved away from the substrate 209. FIG. 4B schematically illustrates the brush box module 202 when the scrubber brush assemblies 240 are moved towards the substrate 209 and in contract with the substrate 209, which is generally the case when the substrate 209 is being cleaned. FIG. 5A is a schematic side view of the positioning assembly 250.

Referring to FIG. 3, each scrubber brush assembly 240 is disposed in the processing volume 222, extended through the membrane seal 247, and coupled to two pivoting plates 251 on opposite ends. The pivoting plates 251 are movably coupled to a mounting block 254 secured to the supporting frame 201. Each pivoting plate 251 is pivotable about a pivoting joint 258. The two pivoting plates 251 connected to each scrubber brush assembly 240 are coupled to each other by a synchronizing bar 259 configured to synchronize motions of the two pivoting plates 251.

Referring to FIG. 5A, each pivoting plate 251 is coupled to an actuating bar 252. An actuator 253 is coupled between the two actuating bars 252 disposed on one side of the body 204. The actuator 253 is configured to move the actuating bars 252 relative to each other. A sliding block 256 is also coupled between the two actuating bars 252. Each actuating bars 252 is connected to the sliding block 256 via a link 257. A vertical track 255 is coupled to the mounting block 254. The sliding block 256 is capable of sliding vertically along the vertical track 255.

Figure 5B:
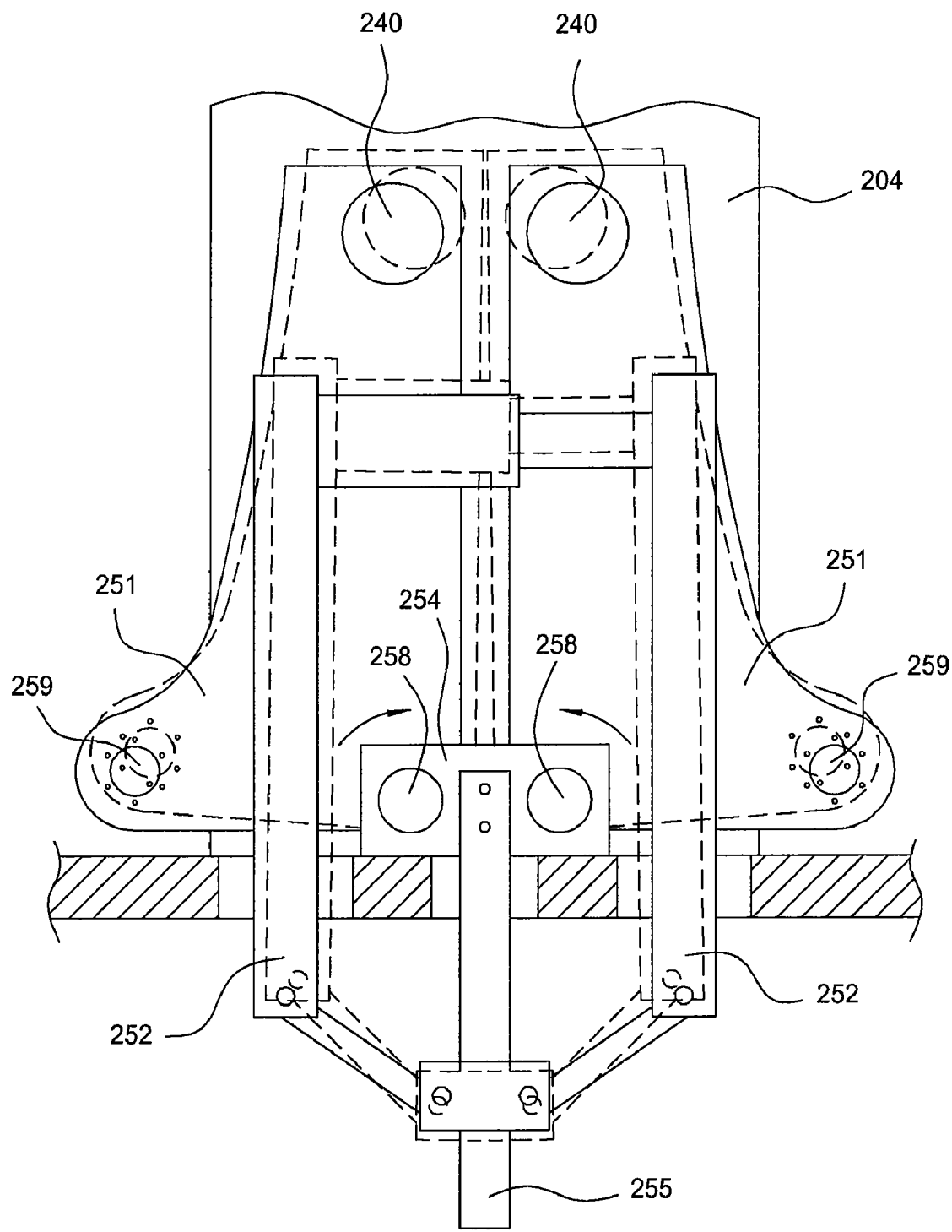
FIG. 5B is a schematic partial side view of the brush box module of FIG. 3 showing movement of a positioning assembly.

During operation, the actuator 253 extends or retracts to move the actuating bars 252 relative to one another. The motion of the actuating bars 252 is restrained by the links 257 and the sliding block 256, therefore, the motion is substantially symmetric. The motion of the actuating bars 252 causes the pivoting plates 251 to pivot about the pivoting joint 258, thus, causing the scrubber brush assemblies 240 to move in symmetric manner. At the same time, the synchronizing bars 259 pivot about the pivoting joints 258 transferring to motion of the pivoting plates 251 from one side of the body 204 to the other side, and synchronizing motion on opposite ends of the scrubber brush assemblies 240. FIG. 5B schematically illustrates the positioning assembly 250 moving the scrubber brush assemblies 240 from an outer position (in solid lines) to an inner position (in dashed lines). As shown in FIG. 5B, the scrubber brush assemblies 240 moves in a substantially mirror symmetry about the substrate 209 being processed.

In one embodiment, a force between the substrate 209 and the scrubber brush 241 is monitored to prevent damage to the substrate 209 during cleaning. In one embodiment, the force between the substrate 209 and the scrubber brush 241 is monitored by measuring one or more operational parameters of the actuator 253. In one embodiment, the actuator 253 comprises a linear cylinder and monitoring operational parameter of the actuator 253 comprises monitoring a pressure of the linear cylinder. In one embodiment, a pressure sensor is coupled to the actuator 253 and a system controller 232. The system controller 232 determines an end point of the actuator 253 when the actuator 253 moves the scrubber brush assemblies 240 towards the substrate 209.

The brush box module 202 further comprises cleaning solution spraying bars 220 disposed in the processing volume 222. In one embodiment, two cleaning solution spraying bars 220 are disposed on opposite sides of the processing volume 222 above the scrubber brush assemblies 240 and configured to direct cleaning solutions towards both sides of the substrate 209 during cleaning. In one embodiment, each of the cleaning solution spraying bar 220 has a plurality of nozzles 220a disposed lengthwise. The plurality of nozzles 220a are configured to direct cleaning solution towards the substrate 209. In one embodiment, the plurality of nozzles 220a are evenly distributed along each of the cleaning solution spray bars 220 respectively.

The brush box module 202 further comprises water spraying bars 219 disposed above the cleaning solution spraying bars 220. Each of the water spraying bars 219 has a plurality of spraying nozzles 219a disposed along the length. In one embodiment, the water spraying bars 219 are configured to spray D1 water towards the substrate 209 when the substrate 209 is being transferred into or out of the processing volume 222. In one embodiment, the water spraying bars 219 are used to wet the substrate 209 prior to cleaning.

An exemplary cleaning process using the brush box module assembly 200 may be as follows. The sliding lid 203 slides back exposing the openings 205 of the brush box modules 202. The actuator 253 extends to pivot the pivoting plates 251 outward and move the scrubber brush assemblies 240 to the sides of the processing volume 222. The substrate handler transfers two substrates 209 over the openings 205, then lowers the substrate 209 into the processing volumes 222 without contacting the substrate 209 with the scrubber brush assemblies 240. The substrate handler then exits the processing volume 222 and the sliding lid 203 moves to close the openings 205.

The water spraying bars 219 spray water towards the substrate 209 to wet the substrate 209 in each brush box module 202 while the substrates 209 are lowered into the processing volumes 222. The substrate rollers 210, 211 receive the substrate 209 and the substrate handler exits the processing volume 222. The substrate 209 is rotated by the substrate rollers 210, 211. The sensor wheel 216 is passively rotated along with the substrate 209 and the rotation sensor 226 transmits a rotational signal to the system controller 232, which controls the substrate rollers 210 according to the signals from the rotation sensor 226 to ensure a selected rotational rate.

The actuator 253 then retracts to move the scrubber brush assemblies 240 inward towards the substrate 209 while the motors 244 rotate the scrubber brushes 241 and cleaning solutions supplied to the scrubber brushes 241 from the cleaning solution supply 249 through the mandrel assembly 242. The system controller 232 monitors one or operational parameters of the actuator 253 to determine the force applied to the substrate 209 by the scrubber brush assemblies 240. In one embodiment, the system controller 232 stops the actuator 253 once the monitored operational parameters reach a critical value. In one embodiment, the monitored operational parameters comprise a pressure of a linear cylinder of the actuator 253. The scrubber brushes 241 are rotating against the substrate 209 to perform a cleaning step in a scrubbing motion. The cleaning step is generally performed according to a process recipe. In one embodiment, cleaning solution is also supplied to the substrate 209 via the solution cleaning bars 220.

After the substrate 209 is cleaned, the actuator 253 extends to release the substrate 209. The sliding lid 203 moves to expose the openings 205 and the substrate handler lowers into the processing volumes 222 to pick up the substrates 209.

While the foregoing is directed to embodiments of the present invention, other and further embodiments of the invention may be devised without departing from the basic scope thereof, and the scope thereof is determined by the claims that follow.

What is claimed is:

1. A substrate cleaner, comprising:
a chamber body defining a processing volume, wherein the chamber body has a top opening configured to allow passage of a substrate;
first and second scrubber brush assemblies movably disposed in the processing volume, wherein the first and second scrubber brush assemblies are configured to contact and clean opposite surfaces of a substrate disposed in the processing volume; and
a positioning assembly configured to simultaneously adjust positions of the first and second scrubber brush assemblies, wherein the positioning assembly makes substantially the same amount of adjustment to the first and second scrubber brush assemblies in mirror symmetry, and the positioning assembly comprises:
a sliding block configured to slide along a track coupled to the chamber body, wherein the first and second scrubber brush assembly are positioned substantially symmetrical about the track;
a first link, wherein a first end of the first link is connected to the sliding block, and a second end of the first link is connected with the first scrubber brush assembly; and
a second link, wherein a first end of the second link is connected to the sliding block, a second end of the second link is connected with the second scrubber brush assembly, and the first and second links and the sliding block limit motion of the first and second scrubber brush assemblies to be substantially symmetrical.

2. The substrate cleaner of claim 1, further comprising:
a first pivoting plate pivotable about a first pivoting joint, wherein a first end of the first scrubber brush assembly is mounted on the first pivoting plate; and
a second pivoting plate pivotable about a second pivoting joint, wherein a first end of the second scrubber assembly is mounted on the second pivoting plate, the first and second pivoting plates are disposed substantially symmetrical, the positioning assembly is coupled between the first and second pivoting plates.

3. The substrate cleaner of claim 2, wherein the positioning assembly further comprises:
an actuator configured to move the first and second pivoting plates symmetrically and relative to each other.

4. The substrate cleaner of claim 3, wherein the positioning assembly further comprises a sensor configured to measure an operational parameter of the actuator, and the operational parameter is used to determine a force applied to the substrate by the scrubber brush assemblies.

5. The substrate cleaner of claim 3, wherein positioning assembly further comprises:
a first actuating bar coupled to the actuator, wherein the first actuating bar is coupled to the first pivoting plate; and
a second actuating bar coupled to the actuator, wherein the second actuating bar is coupled to the second pivoting plate, and the actuator moves the first and second actuating bars relative to each other, wherein the second end of the first link is connected with the first scrubber brush assembly via the first actuating bar, and the second end of the second link is connected with the second scrubber brush assembly via the second actuating bar.

6. The substrate cleaner of claim 5, wherein the actuator comprises a linear cylinder connected between the first and second actuating bars.

7. The substrate cleaner of claim 6, wherein the positioning assembly further comprises a pressure sensor configured to measure a pressure of the linear cylinder, and the pressure of the linear cylinder is used to determine a force applied to the substrate by the scrubber brush assemblies.

8. The substrate cleaner of claim 3, further comprising:
a third pivoting plate, wherein the first and third pivoting plates are disposed on opposite sides of the chamber body, and a second end of the first scrubber process assembly is mounted on the third pivoting plate;
a first synchronizing bar coupled between the first and third pivoting plates, wherein the first synchronizing bar is configured to ensure synchronized motion between the first and third pivoting plates;
a fourth pivoting plate, wherein the second and fourth pivoting plates are disposed on opposite sides of the chamber body, and a second end of the second scrubber process assembly is mounted on the fourth pivoting plate; and
a second synchronizing bar coupled between the second and fourth pivoting plates, wherein the second synchronizing bar is configured to ensure synchronized motion between the second and fourth pivoting plates.

9. The substrate cleaner of claim 2, wherein each of the first and second scrubber assemblies comprises:
a cylindrical scrubber brush having a plurality of surface protrusions;
a mandrel supporting the cylindrical scrubber brush, wherein the mandrel has an inner volume and a plurality of openings distributed lengthwise;
two mounting shafts coupled opposite ends of the mandrel, wherein the mounting shafts are connected with the positioning assembly; and
a rotating motor configured to rotate the cylindrical scrubber brush along a long axis.

10. The substrate cleaner of claim 2, further comprising one or more cleaning solution spraying bars disposed in the processing volume, wherein the one or more cleaning solution spraying bars are configured to direct fluid towards the substrate during processing.

11. A substrate cleaner, comprising:
a chamber body defining a processing volume, wherein the chamber body has a top opening configured to allow passage of a substrate;
first and second scrubber brush assemblies movably disposed in the processing volume, wherein the first and second scrubber brush assemblies are configured to contact and clean opposite surfaces of a substrate disposed in the processing volume;
a first pivoting plate pivotable about a first pivoting joint, wherein a first end of the first scrubber brush assembly is mounted on the first pivoting plate;
a second pivoting plate pivotable about a second pivoting joint, wherein a first end of the second scrubber assembly is mounted on the second pivoting plate, the first and second pivoting plates are disposed substantially symmetrical, the positioning assembly is coupled between the first and second pivoting plates; and a positioning assembly configured to simultaneously adjust positions of the first and second scrubber brush assemblies, wherein the positioning assembly makes substantially the same amount of adjustment to the first and second scrubber brush assemblies in mirror symmetry, the positioning assembly comprises:
an actuator configured to move the first and second pivoting plates symmetrically and relative to each other;
a first actuating bar coupled to the actuator, wherein the first actuating bar is coupled to the first pivoting plate;
a second actuating bar coupled to the actuator, wherein the second actuating bar is coupled to the second pivoting plate, and the actuator moves the first and second actuating bars relative to each other;
a sliding block configured to slide along a track coupled to the body, wherein the first and second pivoting plates positioned substantially symmetrical about the track;
a first link, wherein a first end of the first link is connected to the sliding block, and a second end of the first link is connected with the first actuating bar; and
a second link, wherein a first end of the second link is connected to the sliding block, a second end of the second link is connected with the second actuating bar, and the first and second links and the sliding block limit motion of the first and second actuating bars to be substantially symmetrical.

12. The substrate cleaner of claim 11, wherein the actuator comprises a linear cylinder connected between the first and second actuating bars.

13. The substrate cleaner of claim 12, wherein the positioning assembly further comprises a pressure sensor configured to measure a pressure of the linear cylinder, and the pressure of the linear cylinder is used to determine a force applied to the substrate by the scrubber brush assemblies.

14. The substrate cleaner of claim 11, wherein the positioning assembly further comprises a sensor configured to measure an operational parameter of the actuator, and the operational parameter is used to determine a force applied to the substrate by the scrubber brush assemblies.

15. The substrate cleaner of claim 11, comprising one or more cleaning solution spraying bars disposed in the processing volume, wherein the one or more cleaning solution spraying bars are configured to direct fluid towards the substrate during processing.

16. A substrate cleaner, comprising
a chamber body defining a processing volume, wherein the chamber body has a top opening configured to allow passage of a substrate;
first and second scrubber brush assemblies movably disposed in the processing volume, wherein the first and second scrubber brush assemblies are configured to contact and clean opposite surfaces of a substrate disposed in the processing volume;
an actuator having a first end connected with the first scrubber brush assembly and a second end connected to the second scrubber brush assembly;
a restraint assembly connected between the first end and second end of the actuator, wherein the restraint assembly comprises:
a sliding block configured to slide along a track coupled to the chamber body, wherein the first and second scrubber brush assembly are positioned substantially symmetrical about the track; and
a first link having a first end connected to the sliding block and a second end connected with the first end of the actuator;

17. The substrate cleaner of claim 16, wherein the restraint assembly further comprise a second link having a first end connected to the sliding block and a second end connected with the second end of the actuator, wherein the first and second links and the sliding block limit motion of the first and second scrubber brush assemblies to be substantially symmetrical.

18. The substrate cleaner of claim 17, wherein the actuator is a linear cylinder.

19. The substrate cleaner of claim 18, wherein the restraint assembly further comprises:

a first actuating bar coupled between the first end of the actuator and the second end of the first link; and a second actuating bar coupled between the second end of the actuator and the second end of the second link.

20. The substrate cleaner of claim 18, further comprising a pressure sensor configured to measure a pressure of the linear cylinder, and the pressure of the linear cylinder is used to determine a force applied to the substrate by the first and second scrubber brush assemblies.

* * * * *

UNITED STATES PATENT AND TRADEMARK OFFICE
CERTIFICATE OF CORRECTION

PATENT NO. : 7,962,990 B2  
APPLICATION NO. : 12/243700  
DATED : June 21, 2011  
INVENTOR(S) : Chen et al.

Page 1 of 1

It is certified that error appears in the above-identified patent and that said Letters Patent is hereby corrected as shown below:

In the Detailed Description:

Column 7, Line 21, please delete "D1" and insert --DI-- therefor.

Signed and Sealed this  
Thirteenth Day of September, 2011

David J. Kappos  
*Director of the United States Patent and Trademark Office*